(12) United States Patent
Santos et al.

(10) Patent No.: US 8,297,472 B2
(45) Date of Patent: Oct. 30, 2012

(54) PELLET LOADER WITH PELLET SEPARATOR FOR MOLDING IC DEVICES

(75) Inventors: Norbert Joson Santos, Baguio (PH); Edgar Dorotayo Balidoy, Benguet (PH); Anthony Steven Dominisac Panagan, Baguio (PH); Freddie Mariano Dela Cruz, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 34 days.

(21) Appl. No.: 12/954,427

(22) Filed: Nov. 24, 2010

(65) Prior Publication Data

US 2012/0126453 A1    May 24, 2012

(51) Int. Cl.
  *B65H 3/44* (2006.01)
  *B65H 1/08* (2006.01)
(52) U.S. Cl. ............ 221/95; 221/93; 221/232; 221/225; 221/233; 221/192
(58) Field of Classification Search ............ 221/95, 221/192, 246, 93, 225, 232–233, 13; 156/566
See application file for complete search history.

(56) References Cited

U.S. PATENT DOCUMENTS

| | | | | |
|---|---|---|---|---|
| 2,493,616 A * | 1/1950 | Burns | ............ | 221/97 |
| 3,963,456 A * | 6/1976 | Tsuchiya et al. | ............ | 29/739 |
| 4,127,432 A * | 11/1978 | Kuwano et al. | ............ | 156/297 |
| 4,292,116 A * | 9/1981 | Takahashi et al. | ............ | 156/566 |
| 4,375,126 A * | 3/1983 | Dull et al. | ............ | 29/740 |
| 4,389,272 A * | 6/1983 | Ferri et al. | ............ | 156/297 |
| 4,451,324 A * | 5/1984 | Ichikawa et al. | ............ | 156/562 |
| 4,465,206 A * | 8/1984 | Sorel et al. | ............ | 221/94 |
| 4,476,626 A * | 10/1984 | Gumbert et al. | ............ | 29/740 |
| 4,670,981 A * | 6/1987 | Kubota et al. | ............ | 29/840 |
| 6,331,225 B1 * | 12/2001 | Sugiyama | ............ | 156/299 |
| 7,204,068 B2 * | 4/2007 | Neuhoff et al. | ............ | 53/452 |
| 2008/0277829 A1 | 11/2008 | Hao et al. | | |

* cited by examiner

*Primary Examiner* — Michael K Collins

(74) *Attorney, Agent, or Firm* — Steven A. Shaw; W. James Brady; Frederick J. Telecky, Jr.

(57) ABSTRACT

A pellet loading apparatus includes a tablet pusher including a support surfaces including a pusher mechanism coupled thereto for vertical movement upon actuation. A tablet holder on the tablet pusher includes locations framed by sidewall members aligned in the vertical direction that form columns having open tops for holding a pellet stacks of mold component pellets. A pellet separator having a solid portion and apertures is sized to fit around a portion of a top mold pellet in the pellet stacks. The pellet separator includes a pellet drive for lateral moving the top mold pellets relative to under pellets so that after lateral movement the top mold pellets are laterally offset from the under pellets. A tablet lifter includes a pellet stopper having receiving positions for receiving top mold pellets upon receipt after a transfer actuation of the pusher mechanism.

6 Claims, 6 Drawing Sheets

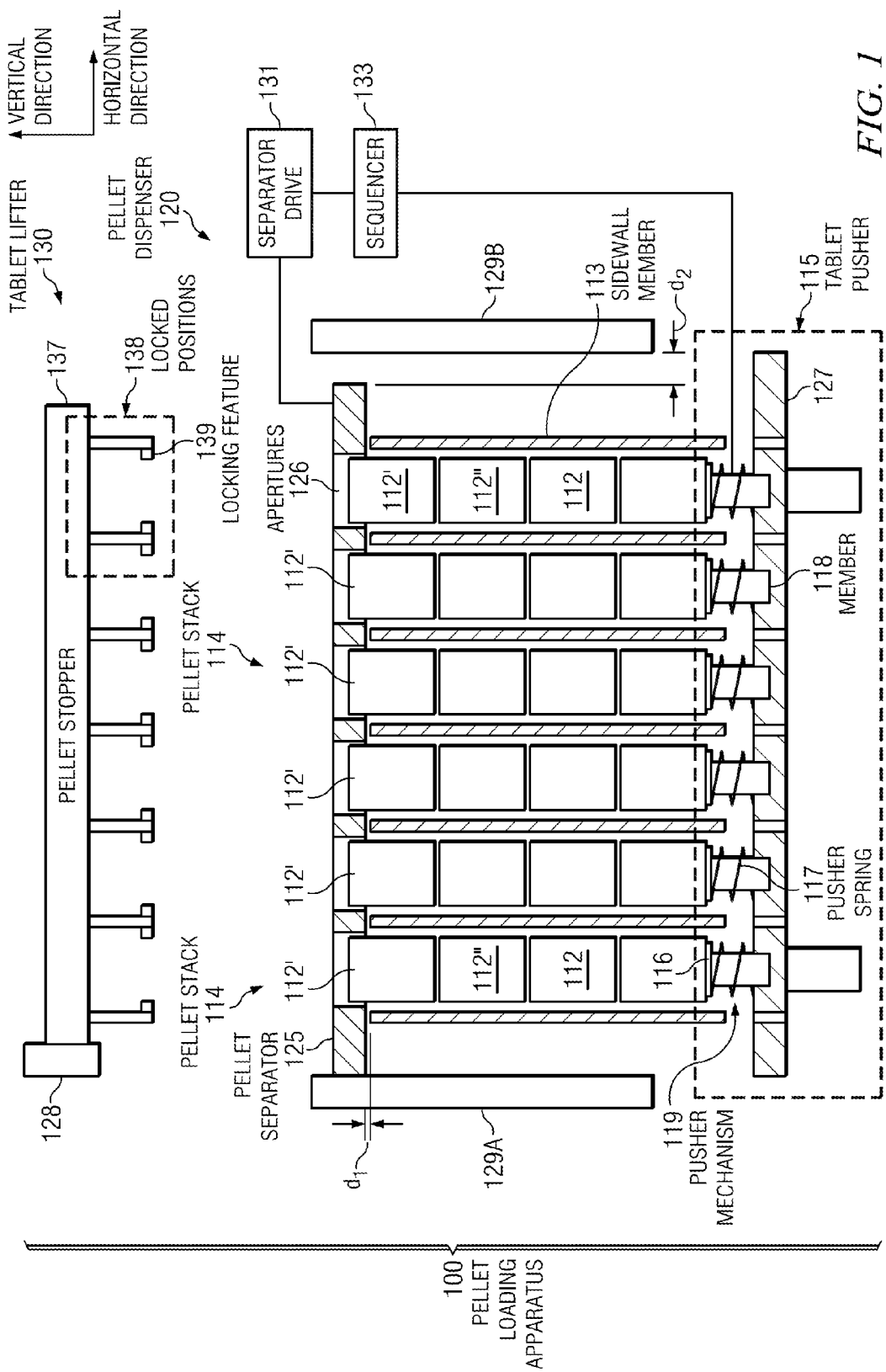

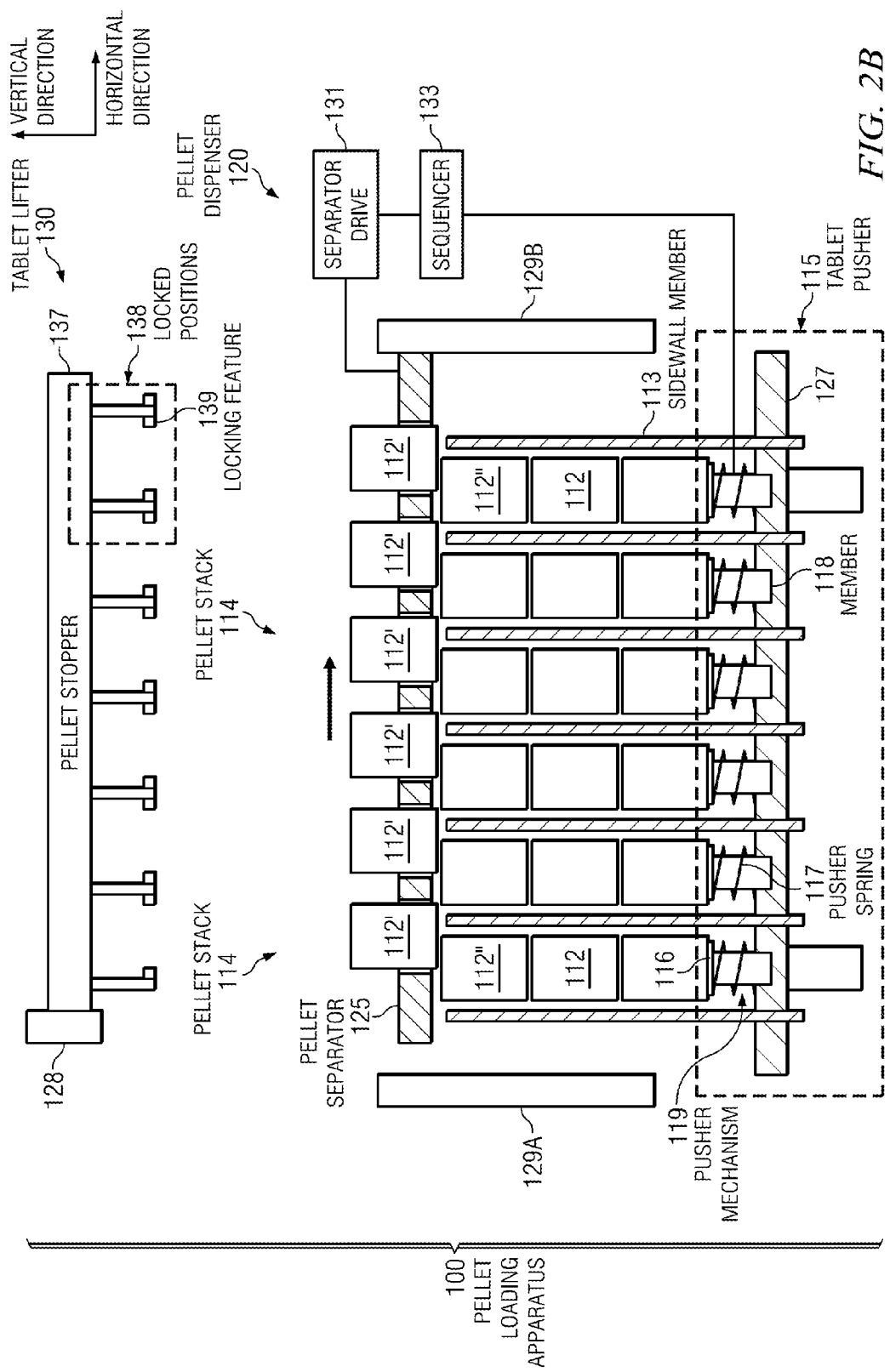

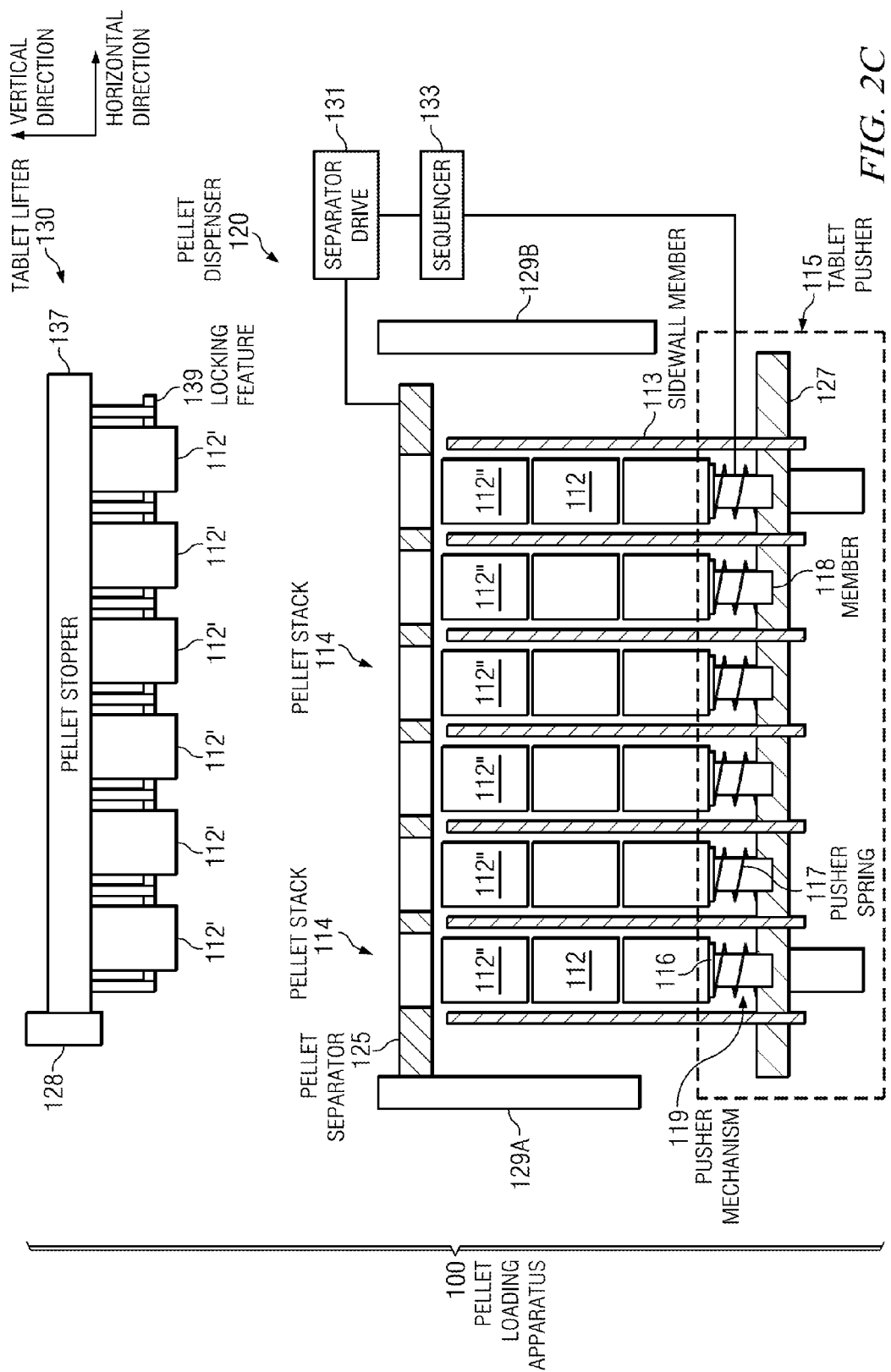

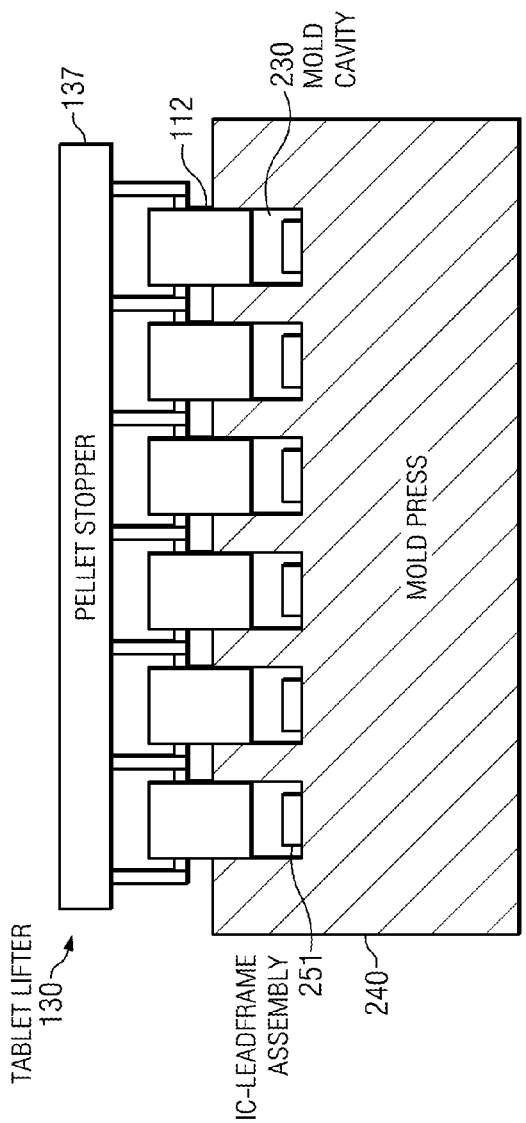
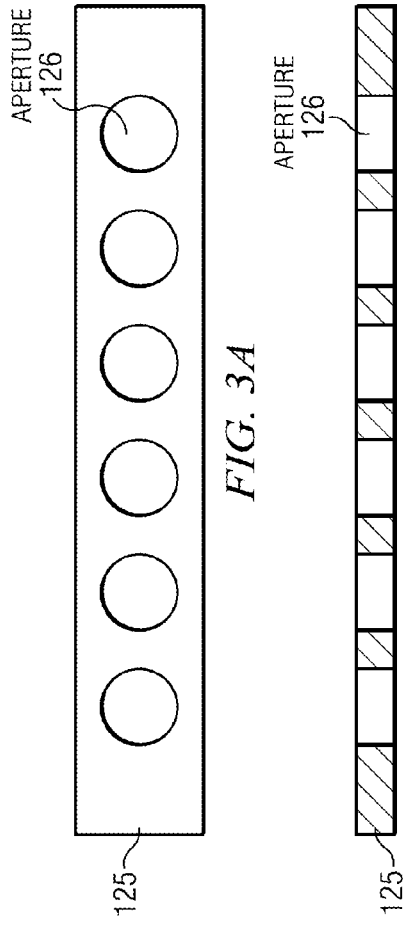

PELLET LOADER WITH PELLET SEPARATOR FOR MOLDING IC DEVICES

FIELD

Disclosed embodiments relate to semiconductor device assembly. More particularly, disclosed embodiments relate to pellet loading apparatus and the transfer molding of integrated circuit devices.

BACKGROUND

Integrated circuit (IC) devices are manufactured by forming layered metallic circuit components and patterns on a semiconductor wafer. Numerous IC die are formed on a single wafer. The individual IC die on the wafer are separated from one another by a singulation process, such as sawing. Each IC die is typically mounted on a metallic leadframe, and the IC-leadframe assembly is then encapsulated within a package. Packaging material, or "encapsulant" is commonly made from viscous or semi-viscous plastic or epoxy resin, which is cured to form a hardened protective cover to protect the IC assembly from environmental hazards such as dust, heat, moisture, mechanical shock, and external electricity.

IC packaging is conventionally accomplished using a molding process. The specifics of the molding process are influenced by many factors such as the IC and leadframe geometry, and encapsulant material used, but generally proceeds along the lines of one of the most widely used manufacturing processes, known as transfer molding.

In conventional transfer molding a pellet load operation is performed by pellet loading apparatus including a pellet dispenser that has a plurality of stacks of mold compound solid pellets that are between adjacent vertical members known as magazines and a tablet lifter section comprising a pellet stopper having a plurality of pellet receiving positions. The pellet dispenser includes a tablet pusher which applies a spring force in the vertical direction. The spring force is intended to transfer only the top pellets in each pellet stack at each transfer time into the receiving positions of the pellet stopper. The tablet lifter then transfers the pellets received into a mold of a molding section that holds IC-leadframe assemblies in molding cavities, where the mold compound is melted by the application of heat and pressure to a fluid state. The liquefied mold compound is then forced by a plunger into runners connected between the plunger and molding cavities to encapsulate the IC-leadframe assemblies, followed by cooling and removal from the molding cavities.

One problem with transfer molding occurs when more than one pellet (typically two pellets) is transferred (resulting in double pellet transfer) into respective mold cavities in the mold section from the pellet stopper during pellet transfer. A known solution to double pellet transfer is to stop the molding machine to allow removal of the extra pellets from the pellet stopper, then reinitializing the molding machine. Although this known solution is effective in clearing the problem, the clearing process results in system downtime and results in the loss of productivity.

SUMMARY

Disclosed embodiments include solutions to the problem of pellet sticking that can result in more than one pellet being transferred to into respective mold cavities in the mold press section from a pellet stopper of a tablet lifter during pellet transfer. Disclosed embodiments recognize that double pellet transfer can occur due to pellet sticking between the top pellet and its adjacent pellet (generally referred to herein as the "under pellet") in the pellet stacks while in the pellet dispenser that can result in a double pellet pickup into the receiving positions of the pellet stopper.

In one embodiment, a new transfer molding tool for the pellet loading section referred to herein as a "pellet separator" moves the top pellets in the pellet stack relative to the under pellets to break the adhesion force between the top pellets and under pellets to generally eliminate, or at least significantly reduce, the occurrence of multiple pellet pickup. After breaking the adhesion force, the top pellets are then be loaded into the pellet stopper of the tablet lifter. Since the pellet stoppers receive only the top pellets, double pellet transfer is avoided because only the top pellets are transferred into respective mold cavities in the mold section from the pellet stopper during pellet transfer.

BRIEF DESCRIPTION OF THE DRAWINGS

FIG. 1 shows an example pellet loading apparatus including a pellet dispenser comprising a pellet separator having apertures sized to fit around a portion of a top mold pellet in the pellet stacks that provides lateral movement of the top mold pellets relative to the under pellets in the pellet stacks to reduce pellet sticking before pellet transfer to a pellet stopper of a tablet lifter, according to a disclosed embodiment.

FIGS. 2A-C show successive positions of components in the pellet loading apparatus shown in FIG. 1 including a tablet pusher up position, a laterally translated position where the top mold pellets in the pellet stacks are laterally moved relative to the under pellets, and the pellets loaded in the tablet lifter position, respectively, according to disclosed embodiments.

FIG. 2D shows a tablet lifter positioned to transfer mold pellets in its pellet stopper to a mold press having mold cavities each having an IC-leadframe assembly therein, according to an example embodiment.

FIGS. 3A and 3B show a top view and a side view of an example pellet separator comprising a plate having circular apertures sized to fit around top mold pellets in pellet stacks, according to an example embodiment.

DETAILED DESCRIPTION

Figure 2A:
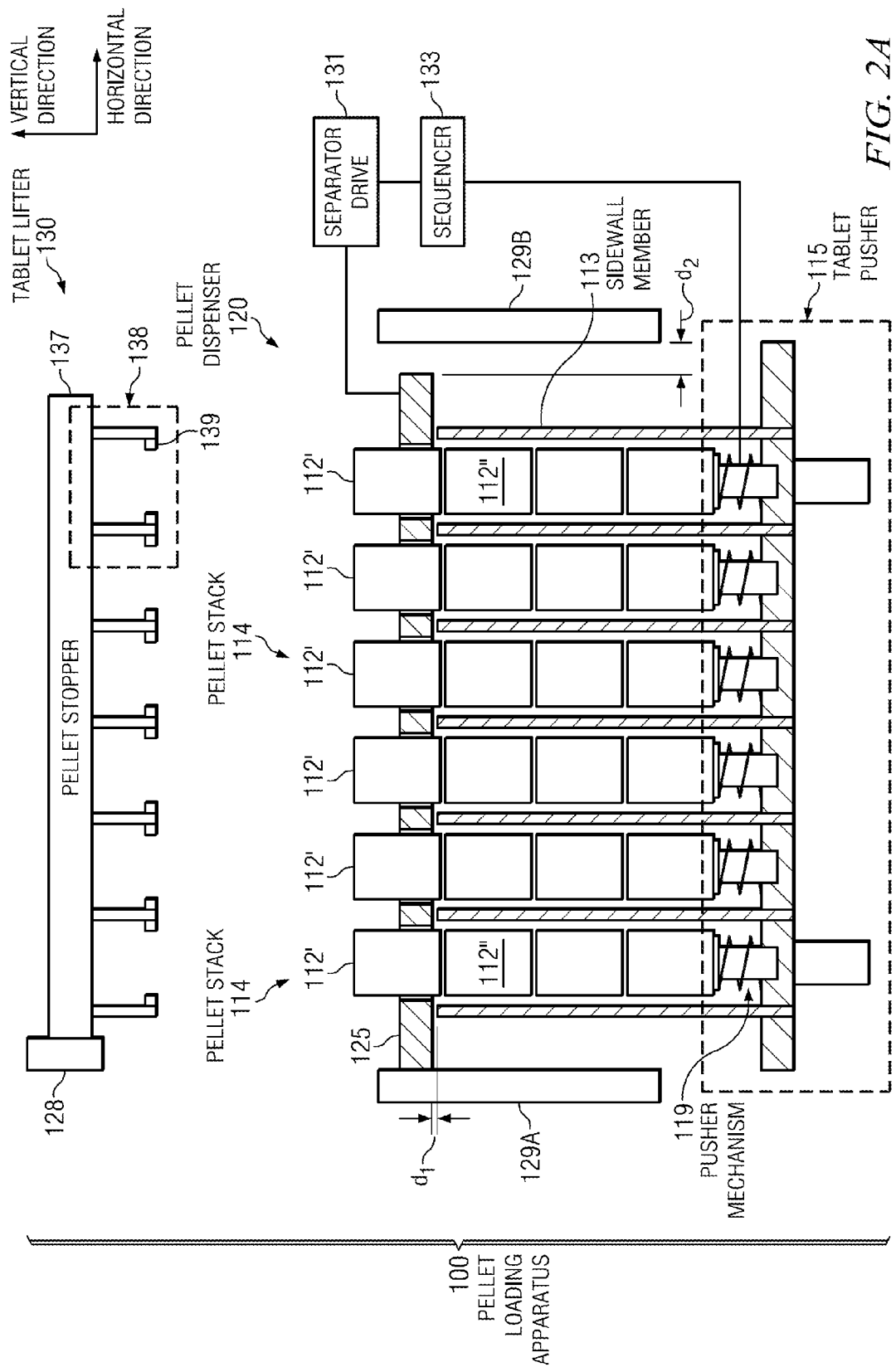

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 shows an example pellet loading apparatus 100 including a pellet dispenser 120 comprising a pellet separator 125 comprising a solid portion having apertures 126 formed in the solid portion sized to fit around a top mold pellet 112' in pellet stacks 114 that comprise a plurality of mold pellets 112, according to a disclosed embodiment. Pellet separator 125 provides lateral (horizontal) movement of the top mold pellets 112' relative to its under pellets pellet 112" to reduce pellet sticking before pellet transfer of top pellet 112' to a pellet stopper 137 of a tablet lifter 130.

Pellet dispenser 120 includes a tablet pusher 115 including a base portion 127 having pusher mechanisms 119 shown comprising a movable member 118 having a top support surface 116 including a pusher spring 117 for movement in the vertical direction upon spring actuation. Pellet dispenser 120 includes a plurality of columns having open tops for receiving and holding pellet stacks 114, and comprises sidewall members 113 sometimes referred to as "magazines". Support surfaces 116 form the bottom of the columns. In the position shown in FIG. 1, the bottom of the pellet separator 125 is positioned a distance shown as $d_1$ from the top of the magazines 113. In one embodiment, $d_1$ can be from 1 to 3 mm.

The pellet separator 125 has a separator drive (e.g., drive motor) 131 that provides lateral movement of the top mold pellets 112' relative to the under pellets 112" and the other pellets 112 in the pellet stacks 114 so that the top mold pellets 112' can be laterally offset but still partially over the pellet stacks 114. A sequencer 133 is shown coupled to the separator drive 131 and the pusher mechanism 119 for time coordination of the pellet movements in pellet loading apparatus 100 described below.

The tablet lifter 130 includes a pellet stopper 137 having a plurality of locked receiving positions 138 including locking features 139 for receiving and securing the top mold pellet 112' upon receipt from the pellet dispenser 120 after the transfer actuation of the pusher mechanism 119.

The tablet lifter 130 and pellet separator 125 are both shown including fixed position defining end stops 128 and 129A/129B, respectively, for setting the position by bounding the movement in the horizontal direction for tablet lifter 130 and pellet separator 125, respectively. Pellet stopper 137 is shown positioned against end position defining end stop 128, while pellet separator 125 is shown in a position that is spaced apart a distance $d_2$ from end position defining stop 129B. This spacing shown defines the limits of horizontal movement and thus the horizontal position of the pellet separator 125 after actuation of the separator drive 131 as described below, such as ½ the linear dimension (e.g., width) of the pellets 112.

In a typical embodiment, position defining end stops 128, 129A and 129B have a thickness that is about ½ the linear dimension (e.g., width) of the mold pellets 112, such as 6.5 mm thick for 13 mm diameter pellets 112. This thickness dimension helps ensure that pellets 112 will not fall on the magazines 113 and for alignment to the tablet lifter 130 during pick up. Although shown to control position by bounding movement along only one of the horizontal plane directions (e.g., x-direction), position defining end stops 128, 129A and 129B can be placed in both horizontal plane directions (x and y direction) for controlling position in both horizontal plane directions (e.g., x and y direction).

FIGS. 2A-C show successive positions of components in the pellet loading apparatus 100 shown in FIG. 1 including a tablet pusher up position, a laterally translated position where the top mold pellets 112' in the pellet stacks are laterally moved relative to the under pellets 112", and the pellets loaded in the tablet lifter position, respectively, according to disclosed embodiments. FIG. 2A shows the mold pellets 112 in the pellet stacks 114 vertically translated from the configuration shown in FIG. 1 after actuation of pusher mechanism 119 to raise the pellets 112 in pellet stacks 114 in the vertical direction relative to the pellet separator 125. The distance vertically translated shown is less than a height of the mold pellets 112, such as 30 to 70% of a height of the pellets, so that the pellet separator 125 is aligned to a bottom portion of the top mold pellets 112' as shown in FIG. 2A.

FIG. 2B shows a laterally translated position following lateral (horizontal) movement of the top mold pellets 112' relative to other mold pellets 112 in the pellet stacks 114 due to horizontal movement of the pellet separator 125 by separator drive 131. The pellet separator 125 is now shown contacting position defining end stop 129B. The lateral movement of the top pellets 112' due to movement of the pellet separator 125 breaks the adhesion (i.e., sticking) that can exist between the top mold pellets 112' and the under pellets 112". The top mold pellets 112' can be seen to now be aligned in the horizontal direction to the locked positions 138 provided by the tablet lifter 130. The lateral movement is generally based on the linear dimension of the pellets 112, typically 30 to 70% of the linear dimension of the pellets 112. For example, if the pellets 112 have a diameter of 13 mm, the lateral movement can be in a range from is 3.9 to 9.1 mm. The lateral movement shown prevents sticking between the top mold pellets 112' to the under pellet 112', due to removal of the contact area.

FIG. 2C shows the top pellets 112' loaded in locked positions 138 of tablet lifter 130 position following actuation of the pusher mechanism 119 which provides the vertical movement to accomplish this transfer. The pellet separator is also shown returned to its horizontal position shown in FIGS. 1 and 2A, now being in contact with position defining end stop 129A. The horizontal movement of the top pellets 112' relative to the under pellets 112" helps ensure that each locked position 138 of the tablet lifter 130 only receives a single mold pellet.

FIG. 2D shows the tablet lifter 130 position during the transfer of mold pellets 112 from the locked positions 138 of tablet lifter 130 to a mold cavity 230 having IC-leadframe assemblies 251 therein provided by a mold press 240, according to an example embodiment. Only a single mold pellet 112 from each of the locked positions 138 of tablet lifter 130 is consistently transferred to the mold cavities 230 because of the relative movement of the mold pellet described above that break the adhesion between the top mold pellet 112' and the under pellets 112".

FIGS. 3A and 3B show a top view and a side view of an example pellet separator 125 shown as a bar having circular apertures 126 sized to fit around a portion of cylindrical mold pellets in pellet stacks, according to an example embodiment. In a typical embodiment, the pellet separator 125 is made of stainless steel. However, other materials may be used, such as certain plastics. The size of the apertures 126 will depend on the size of the pellets, generally being a few millimeters larger in size. For example, if the pellet is cylindrical in shape and has a 13 mm diameter, the apertures may be 15 to 17 mm in diameter. The thickness of the pellet separator 125 is generally 10 to 40% of the height of the mold pellets.

Figure 4:
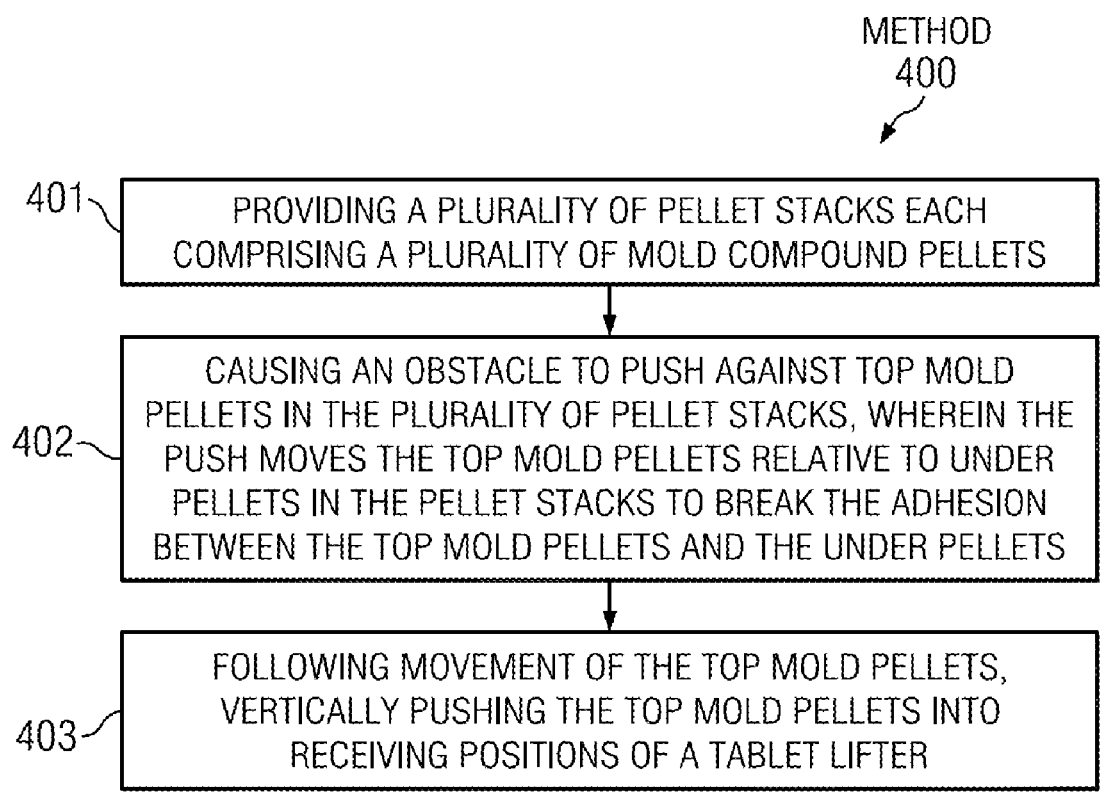
FIG. 4 is a flow chart showing steps in an example method of transfer molding integrated circuit (IC) devices including moving the top pellets relative to the under pellets in pellet stacks to break the adhesion force before transfer of the top pellets to a pellet stopper, according to a disclosed embodiment.

FIG. 4 is a flow chart showing steps in an example method 400 of transfer molding IC devices including step 401 comprising providing a plurality of pellet stacks each comprising a plurality of mold compound pellets. Step 402 comprises causing an obstacle to push against top mold pellets in the plurality of pellet stacks, wherein the push moves the top mold pellets relative to under pellets in the pellet stacks to break adhesion between the top mold pellets and the under pellets. Step 403 comprises following movement of the top mold pellets, vertically pushing the top mold pellets into receiving positions of a tablet lifter.

In one embodiment the push results in laterally moving the top mold pellets relative to the under pellets and other pellets in the pellet stacks so that the top mold pellets are laterally offset, but still partially over the under pellets and other pellets in the pellet stacks. A lateral distanced traversed by the lateral movement can be from 30 to 70% of a width of the mold pellets. The fixed position defining end stops described above can be used for controlling a horizontal position of the tablet lifter and pellet separator.

The obstacle can comprise a pellet separator comprising a solid portion having apertures sized to fit around a surface of the mold pellets, such as example pellet separator 125 shown in FIGS. 3A and 3B. In this embodiment method 400 can further comprise positioning the pellet separator so that the apertures fit around the side surfaces of the top mold pellets, and vertically pushing on a bottom of the plurality of pellet stacks before the laterally moving so that the pellets in the plurality of pellet stacks are vertically moved a distance between 30% to 100% of a length of the mold pellets. The method can also comprise transferring the top mold pellets from the receiving positions of the tablet lifter into a mold press including a plurality of mold cavities each having an IC-leadframe assembly therein, and then molding including compression of molten encapsulant comprising the mold compound for distributing mold compound throughout the plurality of mold cavities to encapsulate the IC-leadframe assemblies.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A pellet loading apparatus, comprising:
    a pellet dispenser, including:
        a tablet pusher including a plurality of support surfaces including a pusher mechanism mechanically coupled to each of said plurality of support surfaces for movement in a vertical direction upon actuation;
        a tablet holder on said tablet pusher including a plurality of locations framed by sidewall members aligned in said vertical direction that form columns having open tops for holding a plurality of pellet stacks each comprising a plurality of mold compound pellets;
        a pellet separator having a solid portion and apertures sized to fit around a portion of a top mold pellet in each said plurality of pellet stacks, wherein said pellet separator includes a pellet drive that provides lateral movement of said top mold pellets relative to under pellets in said plurality of pellet stacks so that after said lateral movement said top mold pellets are laterally offset from said under pellets, and
        a tablet lifter comprising a pellet stopper having a plurality of receiving positions for receiving and securing said top mold pellets upon receipt of said top mold pellets after a transfer actuation of said pusher mechanism.

2. The pellet loading apparatus of claim 1, further comprising a sequencer coupled to said separator drive and said pusher mechanism for sequencing so that said lateral movement of said top mold pellets precedes said transfer actuation of said pusher mechanism.

3. The pellet loading apparatus of claim 1, wherein said plurality of mold compound pellets have a pellet diameter, and said lateral movement is 30 to 70% of said pellet diameter.

4. The pellet loading apparatus of claim 1, wherein said pusher mechanism comprises pusher springs.

5. The pellet loading apparatus of claim 1, wherein said pellet separator comprises a metal.

6. The pellet loading apparatus of claim 1, further comprising fixed position defining end stops for controlling a horizontal position of said tablet lifter and said pellet separator.

* * * * *